(12) United States Patent
Jung et al.

(10) Patent No.: US 12,283,533 B2
(45) Date of Patent: Apr. 22, 2025

(54) TEST CIRCUIT OF SEMICONDUCTOR APPARATUS AND TEST SYSTEM INCLUDING THE SAME

(71) Applicant: SK hynix Inc., Gyeonggi-do (KR)

(72) Inventors: Jong Seok Jung, Gyeonggi-do (KR); Chan Keun Kwon, Gyeonggi-do (KR); Jong Seok Kim, Gyeonggi-do (KR); Young Kwan Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 142 days.

(21) Appl. No.: 18/174,658

(22) Filed: Feb. 27, 2023

(65) Prior Publication Data
US 2024/0178080 A1 May 30, 2024

(30) Foreign Application Priority Data
Nov. 29, 2022 (KR) .......................... 10-2022-0162738

(51) Int. Cl.
*H01L 21/66* (2006.01)
*G01R 31/26* (2020.01)
*G01R 31/28* (2006.01)

(52) U.S. Cl.
CPC .......... *H01L 22/34* (2013.01); *G01R 31/2607* (2013.01); *H01L 22/14* (2013.01); *H01L 22/32* (2013.01); *G01R 31/2879* (2013.01)

(58) Field of Classification Search
CPC ......... H01L 22/10; H01L 22/12; H01L 22/14; H01L 22/20; H01L 22/26; H01L 22/30; H01L 22/32; H01L 22/34; H01L 21/02; H01L 23/544; G01R 31/2644; G01R 31/2648; G01R 31/275; G01R 31/2831; G01R 31/2884; G01R 1/0491; G01R 1/07342
See application file for complete search history.

(56) References Cited

U.S. PATENT DOCUMENTS

| | | | |
|---|---|---|---|
| 4,885,477 A * | 12/1989 | Bird .................... | H03F 3/45076 330/253 |
| 6,445,208 B1 | 9/2002 | Sugamori | |
| 6,737,856 B2 * | 5/2004 | Sander .............. | H03K 17/0822 323/315 |
| 7,009,403 B2 * | 3/2006 | Graf .................. | G01R 19/0092 327/518 |
| 7,221,208 B2 * | 5/2007 | Kubota .............. | H03K 17/0822 327/427 |
| 8,754,635 B2 * | 6/2014 | Bogner .................... | G01R 1/20 324/72 |
| 9,739,811 B2 * | 8/2017 | Zhang .............. | G01R 19/16571 |

(Continued)

FOREIGN PATENT DOCUMENTS

KR 10-2007-0002599 A 1/2007

*Primary Examiner* — Steven L Yeninas
(74) *Attorney, Agent, or Firm* — IP & T GROUP LLP

(57) ABSTRACT

A test circuit of a semiconductor apparatus includes a first resistor, a second resistor and a feed-back loop circuit. The first resistor is coupled between a pad and a test element. The second resistor is coupled to the first resistor in a parallel manner. The feed-back loop circuit is configured to feed a result back to the second resistor, the result being one of comparing a first voltage and a second voltage with each other, the first voltage and the second voltage being applied respectively to the first resistor and the second resistor.

12 Claims, 3 Drawing Sheets

(56) References Cited

U.S. PATENT DOCUMENTS

| | | | |
|---|---|---|---|
| 10,840,700 B2* | 11/2020 | Illing | H03M 1/12 |
| 11,860,199 B2* | 1/2024 | Paolo | G01R 19/0092 |
| 2002/0145138 A1* | 10/2002 | Ishibashi | H01L 22/34 |
| | | | 257/499 |
| 2010/0007328 A1* | 1/2010 | Sander | G01R 19/0092 |
| | | | 324/76.11 |
| 2017/0125309 A1* | 5/2017 | Lee | G01R 31/2884 |
| 2018/0210027 A1* | 7/2018 | Kalt | G01R 31/2601 |
| 2024/0125841 A1* | 4/2024 | Lee | G01R 31/28 |

* cited by examiner

TEST CIRCUIT OF SEMICONDUCTOR APPARATUS AND TEST SYSTEM INCLUDING THE SAME

CROSS-REFERENCES TO RELATED APPLICATION

The present application claims priority under 35 U.S.C. § 119(a) to Korean patent application number 10-2022-0162738, filed on Nov. 29, 2022, which is incorporated herein by reference in its entirety as set forth in full.

BACKGROUND

1. Technical Field

Various embodiments of the present disclosure generally relate to a semiconductor apparatus, and, more particularly, to a test circuit of a semiconductor apparatus and a test system including the same.

2. Related Art

During a fabrication process of a semiconductor apparatus, various tests should be performed e.g., various tests in a wafer level and a package level of the semiconductor apparatus. As one of the various tests, an electrical parameter monitoring (EPM) is performed for testing the electrical characteristics of semiconductor elements in the semiconductor apparatus.

The EPM is performed by probing a test pattern (e.g., a transistor) formed in a scribe lane between dies within a wafer. The EPM is performed in a wafer level through the direct probing scheme in general. The EPM has the geographical limitation of the test pattern and an issue of an increased time amount for the test due to the direct probing scheme. What is needed is an improvement for the wafer level test in order to overcome the limitation and the issue of the EPM.

SUMMARY

In an embodiment of the present disclosure, a test circuit of a semiconductor apparatus may include a first resistor, a second resistor and a feed-back loop circuit. The first resistor may be coupled between a pad and a test element. The second resistor may be coupled to the first resistor in a parallel manner. The feed-back loop circuit may be configured to feed a result back to the second resistor, the result being one of comparing a first voltage and a second voltage with each other, the first voltage and the second voltage being applied respectively to the first resistor and the second resistor.

In an embodiment of the present disclosure, a test circuit of a semiconductor apparatus may include a first signal path, a current dividing circuit, and a feed-back loop circuit. The first signal path may be configured to provide a voltage, which is applied to a first pad, to a first test-target element selected from among a plurality of test-target elements. The current dividing circuit may be configured to divide a current through a second signal path and a third signal path, the current being caused by a voltage applied to a second pad. The feed-back loop circuit may be configured to feed a result back to the third signal path, the result being one of comparing a first voltage and a second voltage with each other, the first voltage and the second voltage being applied respectively to the second path and the third signal path.

In an embodiment of the present disclosure, a test circuit of a semiconductor apparatus may include a first demultiplexer, a first resistor, a second demultiplexer, a second resistor and a feed-back loop circuit. The first demultiplexer may be configured to provide a voltage, which is applied to a first pad, to a first node of a first test-target element selected from among a plurality of test-target elements. The first resistor may be coupled to a second pad. The second demultiplexer may be configured to provide a voltage, which is applied to the first resistor, to a second node of the first test-target element. The second resistor may be coupled to the second pad in parallel with the first resistor. The feed-back loop circuit may be configured to feed a result back to the second resistor, the result being one of comparing a first voltage and a second voltage with each other, the first voltage and the second voltage being applied respectively to the first resistor and the second resistor.

In an embodiment of the present disclosure, a test system may include a semiconductor apparatus and a test equipment. The semiconductor apparatus may include a plurality of dies, one of which includes a test circuit including a first resistor and a second resistor, the first resistor being coupled between a plurality of test-target elements and one of a plurality of pads, the second resistor being coupled to the pad in parallel with the first resistor, the test circuit being configured to feed a result back to the second resistor, the result being one of comparing a first voltage and a second voltage with each other, the first voltage and the second voltage being applied respectively to the first resistor and the second resistor. The test equipment may be configured to perform a test by applying a voltage through the pad and by monitoring a current that flows through the pad according to the voltage.

In an embodiment of the present disclosure, an on-die test circuit, embedded in a semiconductor apparatus, comprises: a first probing pad configured to apply a voltage therethrough; a second probing pad configured to monitor a current flowing therethrough corresponding to the voltage; a test-target element to be tested; a first resistor coupled to the second probing pad and configured to form a first current path between the second probing pad and the test-target element; a second resistor coupled to the second probing pad in parallel with the first resistor and configured to form a second current path coupled the second probing pad; a differential amplifier configured to compare a first voltage corresponding to the first current path and a second voltage corresponding to the second current path; and a feed-back transistor coupled between the second resistor and a ground and configured to form a negative feed-back loop according to an output of the differential amplifier.

DETAILED DESCRIPTION

In accordance with an embodiment, provided may be a test circuit of a semiconductor apparatus and a test system, the test circuit being capable of overcoming the geographical limitation of a test pattern and an issue of an increased test time amount.

Hereinafter, various embodiments of the present disclosure will be described with reference to the accompanying drawings.

As used herein, the terms such as "first" and "second" are used only for distinction between elements and are not used for limitation of the elements or for indication of a particular sequence. As used herein, when an element is expressed as "coupled to" or "connected to" the other element, the element may be electrically or mechanically coupled to or connected to the other element in a direct manner or a coupling relationship or a connection relationship may be electrically or mechanically formed through an intervention of intermediate element between the element and the other element. As used herein, the term "predetermined" may mean that a value of a parameter is pre-determined when a process or an algorithm uses the parameter. According to an embodiment, the value of the parameter may be set when the process or the algorithm starts or while the process or the algorithm is being executed. As used herein, the terms "logic high level" and "logic low level" may be used for describing logic levels of signals. A signal having a "logic high level" is different from a signal having a "logic low level". For example, when a first voltage corresponds to a "logic high level", a second voltage may correspond to a "logic low level". According to an embodiment, a "logic high level" may be higher than a "logic low level". According to an embodiment, logic levels of signals may be embodied as different logic levels or opposite logic levels. For example, according to an embodiment, a signal having a logic high level may be embodied to have a logic low level and a signal having a logic low level may be embodied to have a logic high level.

Figure 1:
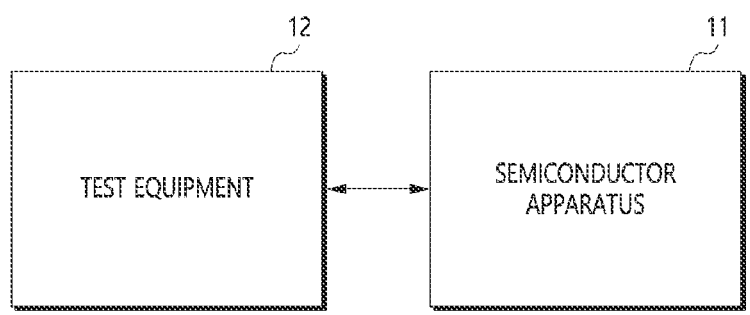
FIG. 1 is a diagram illustrating a configuration of a test system in accordance with an embodiment of the present disclosure.

FIG. 1 is a diagram illustrating a configuration of a test system 10 in accordance with an embodiment of the present disclosure.

Referring to FIG. 1, the test system 10 may include a semiconductor apparatus 11 and a test equipment 12.

The test system 10 may be configured to perform on-die electrical parameter monitoring (EPM) in a wafer level.

The semiconductor apparatus 11 may have a plurality of dies (i.e., semiconductor dies). At least one of the plurality of dies may include a test circuit (i.e., on-die test circuit) therein. The test circuit may include a plurality of test-target elements (i.e., test patterns), a first resistor and a second resistor. The first resistor may be coupled between the plurality of test-target elements and one of a plurality of pads included in the die including the test circuit. The second resistor may be coupled to the pad in parallel with the first resistor. The test circuit may be configured to feed a result back by using the second resistor, the result being obtained by comparing a first voltage applied to the first resistor and a second voltage applied to the second resistor.

Figure 2:
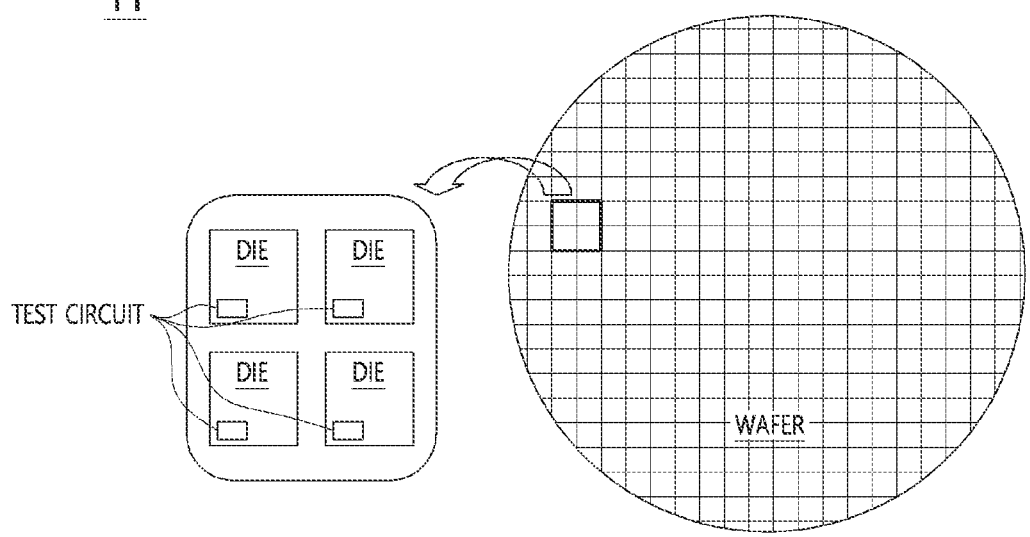
FIG. 2 is a diagram illustrating a configuration of a semiconductor apparatus in accordance with an embodiment of the present disclosure.

The test equipment 12 may perform a test on the semiconductor apparatus 11 by applying a voltage through a pad of the semiconductor apparatus 11 and by monitoring a current that flows through the pad and varies according to the applied voltage. The test equipment 12 may generate control signals suitable for a test operation and provide the control signals to the semiconductor apparatus 11. FIG. 2 is a diagram illustrating a configuration of the semiconductor apparatus 11 in accordance with an embodiment of the present disclosure.

Referring to FIG. 2, the semiconductor apparatus 11 may be a plurality of dies, i.e., a plurality of semiconductor chips included in a wafer. Each of the plurality of dies may include a test circuit therein. The test circuit may be coupled to at least one of pads of the die. The on-die EPM may be performed through the test circuit formed in one of the internal regions within the die.

Figure 3:
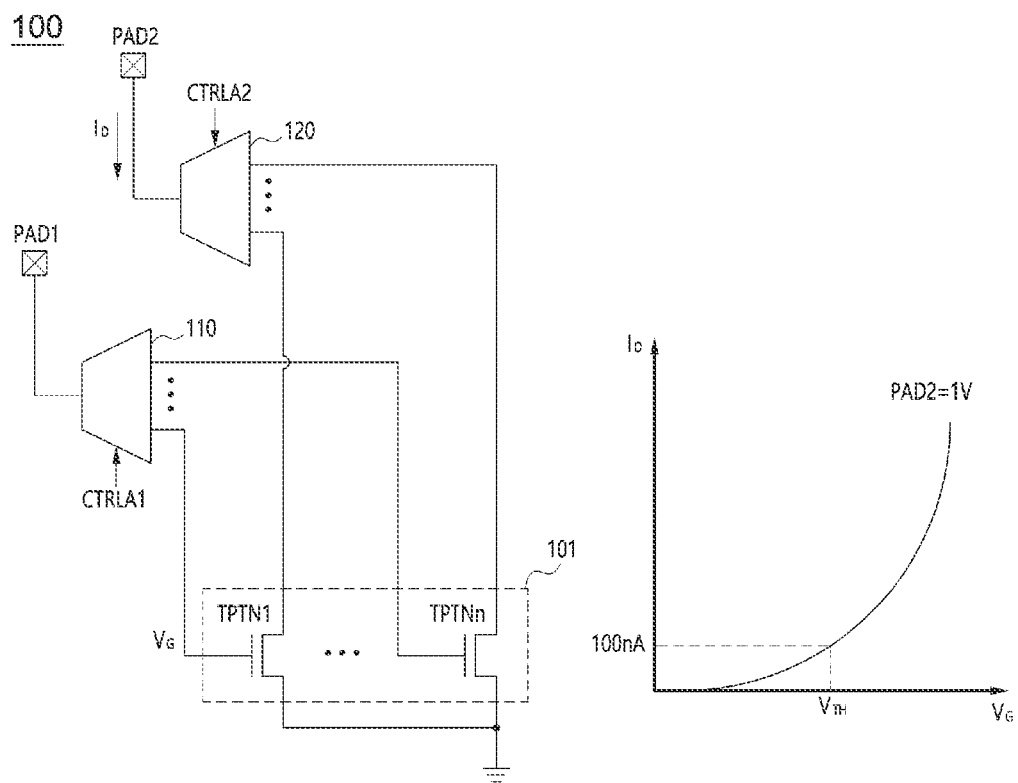
FIG. 3 is a diagram for describing a configuration and an operation of a test circuit of a semiconductor apparatus in accordance with an embodiment of the present disclosure.

FIG. 3 is a diagram for describing a configuration and an operation of a test circuit 100 of a semiconductor apparatus in accordance with an embodiment of the present disclosure. The test circuit 100 may correspond to the test circuit shown in FIG. 3.

Referring to FIG. 3, the test circuit 100 of the semiconductor apparatus may include a plurality of test patterns (i.e., test-target elements) TPTN1 to TPTNn, a first demultiplexer 110 and a second demultiplexer 120.

The plurality of test patterns TPTN1 to TPTNn may be disposed in a reserved region 101 that is not coupled to any circuit related to a normal operation of the semiconductor apparatus 11. Each of the plurality of test patterns TPTN1 to TPTNn may be configured by a basic element (e.g., a transistor). In an embodiment, each of the plurality of test patterns TPTN1 to TPTNn may be configured by an N-type MOS transistor. In an embodiment, each of the plurality of test patterns TPTN1 to TPTNn may be configured by another element such as a P-type MOS transistor, a transistor-based resistor, a transistor-based diode and so forth. The transistors corresponding to the plurality of test patterns TPTN1 to TPTNn may have different sizes from each other.

The first demultiplexer 110 may provide a voltage which is applied to a first pad PAD1, to a first node (i.e., a gate) of a test pattern element selected from among the plurality of test patterns TPTN1 to TPTNn. The first demultiplexer 110 may select one of the plurality of test patterns TPTN1 to TPTNn according to a first control signal CTRLA1 and may provide the selected test pattern with the voltage applied to the first pad PAD1. The first control signal CTRLA1 may include multiple bits, the number of which corresponds to the number of the plurality of test patterns TPTN1 to TPTNn.

The second demultiplexer 120 may provide a voltage which is applied to a second pad PAD2, to a second node (i.e., a drain) of a test pattern element selected from among the plurality of test patterns TPTN1 to TPTNn. The second demultiplexer 120 may select one of the plurality of test patterns TPTN1 to TPTNn according to a second control signal CTRLA2 and may provide the selected test pattern with the voltage that is applied to the second pad PAD2. The second control signal CTRLA2 may include multiple bits, the number of which corresponds to the number of the plurality of test patterns TPTN1 to TPTNn. The first and second pads PAD1 and PAD2 may be probing pads for the test equipment 12 illustrated in FIG. 1.

The test equipment 12 illustrated in FIG. 1 may apply the voltage having a fixed level to the second pad PAD2 and may apply the voltage having a variable level suitable for a test operation to the first pad PAD1. The test equipment 12 may provide the test circuit 100 with the first control signal CTRLA1 and the second control signal CTRLA2 for selecting one from among the plurality of test patterns TPTN1 to TPTNn.

Hereinafter, described will be the test operation of the test circuit 100 in accordance with an embodiment of the present disclosure.

The test circuit 100 may select one test pattern, e.g., the test pattern TPTN1, from among the plurality of test patterns TPTN1 to TPTNn according to the first control signal CTRLA1 and the second control signal CTRLA2.

The test equipment 12 may adjust values of the first control signal CTRLA1 and the second control signal CTRLA2 to select one test pattern, e.g., the test pattern TPTN1 from among the plurality of test patterns TPTN1 to TPTNn.

The test equipment 12 may monitor a current Ip flowing through the second pad PAD2 by changing a level of the voltage, i.e., a gate voltage VG applied to the first pad PAD1 while applying, to the second pad PAD2, the voltage having the fixed level, e.g., 1 V. A threshold voltage VTH as the electrical characteristic of the test pattern TPTN1 may be detected through a pre-determined operation using the voltage level of the first pad PAD1 when the amount of the current Ip of the second pad PAD2 reaches a target value, e.g., 100 nA.

The above-described test operation may be repeated on the remaining test patterns TPTN2 to TPTNn to detect the characteristics of the threshold voltages of the plurality of test patterns TPTN1 to TPTNn, i.e., the N-type MOS transistors mostly configuring the semiconductor apparatus 11.

Figure 4:
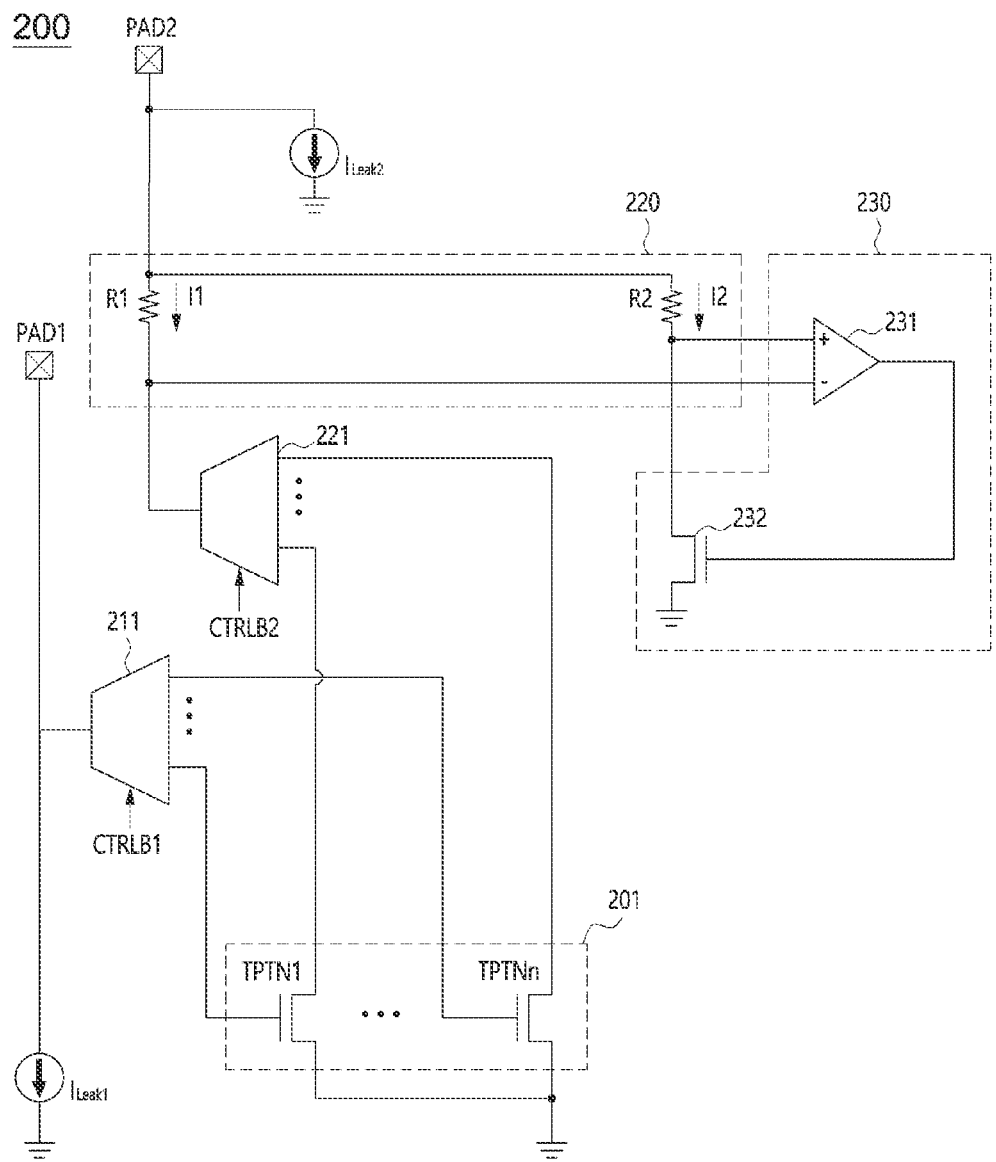
FIG. 4 is a diagram illustrating a configuration of a test circuit of a semiconductor apparatus in accordance with an embodiment of the present disclosure.

FIG. 4 is a diagram illustrating a configuration of a test circuit 200 of a semiconductor apparatus in accordance with an embodiment of the present disclosure. The test circuit 200 may correspond to the test circuit shown in FIG. 3.

Referring to FIG. 4, the test circuit 200 of the semiconductor apparatus may include a plurality of test patterns (i.e., test-target elements) TPTN1 to TPTNn, a current dividing circuit 220, a feed-back loop circuit 230 and first to third signal paths.

The plurality of test patterns TPTN1 to TPTNn may be disposed in a reserved region 201 that is not coupled to any circuit related to a normal operation of the semiconductor apparatus 11. Each of the plurality of test patterns TPTN1 to TPTNn may be configured by a basic element (e.g., a transistor). In an embodiment, each of the plurality of test patterns TPTN1 to TPTNn may be configured by an N-type MOS transistor. In an embodiment, each of the plurality of test patterns TPTN1 to TPTNn may be configured by another element such as a P-type MOS transistor, a transistor-based resistor, a transistor-based diode and so forth. The transistors corresponding to the plurality of test patterns TPTN1 to TPTNn may have different sizes from each other.

The first signal path may be configured to provide a voltage which is applied to a first pad PAD1, to a test pattern selected from among the plurality of test patterns TPTN1 to TPTNn. The first signal path may include one or more signal lines and one or more circuit elements corresponding to a path between the first pad PAD1 and the plurality of test patterns TPTN1 to TPTNn. The first and second pads PAD1 and PAD2 may be probing pads for the test equipment 12 illustrated in FIG. 1.

The first signal path may include a first demultiplexer 211. The first demultiplexer 211 may provide the voltage which is applied to the first pad PAD1, to a first node (i.e., a gate) of the test pattern element selected from among the plurality of test patterns TPTN1 to TPTNn. The first demultiplexer 211 may select one of the plurality of test patterns TPTN1 to TPTNn according to a first control signal CTRLB1 and may provide the selected test pattern with the voltage applied to the first pad PAD1. The first control signal CTRLB1 may include multiple bits, the number of which corresponds to the number of the plurality of test patterns TPTN1 to TPTNn.

The current dividing circuit 220 may include a first resistor R1 and a second resistor R2. The first resistor R1 may be coupled to a second pad PAD2. The second resistor R2 may have a resistance value which is reduced by a predetermined ratio from a resistance value of the first resistor R1. The second resistor R2 may be coupled to the second pad PAD2 in parallel with the first resistor R1.

The second signal path may include one or more signal lines and one or more circuit elements corresponding to a path between the second pad PAD2 and the plurality of test patterns TPTN1 to TPTNn. The second signal path may include the first resistor R1 and a second demultiplexer 221. The second demultiplexer 221 may provide a voltage which is applied to the first resistor R1, to a second node (i.e., a drain) of a test pattern element selected from among the plurality of test patterns TPTN1 to TPTNn. The second demultiplexer 221 may select one of the plurality of test patterns TPTN1 to TPTNn according to a second control signal CTRLB2 and may couple the selected test pattern to the first resistor R1. The second control signal CTRLB2 may include multiple bits, the number of which corresponds to the number of the plurality of test patterns TPTN1 to TPTNn.

The third signal path may be coupled between the second pad PAD2 and a ground. The third signal path may be coupled to the second pad PAD2 in parallel with the second signal path. The third signal path may include one or more signal lines and one or more circuit elements corresponding to a path between the second pad PAD2 and the ground. The third signal path may include the second resistor R2 and a transistor 232.

The feed-back loop circuit 230 may be configured to feed a result back by using the third signal path, the result being obtained by comparing a first voltage and a second voltage with each other, the first voltage applied to the second path and the second voltage applied to the third signal path. The feed-back loop circuit 230 may include a differential amplifier 231 and the transistor 232. The differential amplifier 231 may output the result of comparing the first voltage and the second voltage with each other. The first voltage may be the voltage applied to the second signal path, i.e., the voltage applied to the first resistor R1. The second voltage may be the voltage applied to the third signal path, i.e., the voltage applied to the second resistor R2. The differential amplifier 231 may be configured according to the auto-zeroing scheme that may correct an offset by itself. A chopper circuit may be coupled to an input node and/or an output node of the differential amplifier 231 to eliminate an offset. The transistor 232 may be coupled between the second resistor R2 and the ground. The transistor 232 may adjust, in response to an output of the differential amplifier 231, an amount of current flowing through the third signal path. That is, the transistor (i.e., a feed-back transistor) 232 may form a negative feed-back loop according to the output of the differential amplifier 231.

Hereinafter, described will be the test operation of the test circuit 200 in accordance with an embodiment of the present disclosure.

In this example, the first resistor R1 has the resistance value of 90KΩ and the second resistor R2 has the resistance value of 10KΩ.

Due to physical characteristics of the first pad PAD1 and the second pad PAD2, there may inevitably occur leakage currents. In this example, each of a first leakage current $I_{LEAK1}$ of the first pad PAD1 and a second leakage current $I_{LEAK2}$ of the second pad PAD2 has a value of 20 nA.

The test circuit 200 may select one test pattern, e.g., the test pattern TPTN1 from among the plurality of test patterns TPTN1 to 5 TPTNn according to the first control signal CTRLB1 and the second control signal CTRLB2.

The test equipment 12 may adjust values of the first control signal CTRLB1 and the second control signal CTRLB2 to select one test pattern, e.g., the test pattern TPTN1 from among the plurality of test patterns TPTN1 to TPTNn.

The test equipment 12 may monitor a current Ip flowing through the second pad PAD2 by changing a level of the voltage, i.e., a gate voltage VG applied to the first pad PAD1 while applying, to the second pad PAD2, the voltage having the fixed level, e.g., 1.09 V. The level of the voltage applied to the second pad PAD2 may be adjusted in consideration of the voltage drop due to the first resistor R1 and the second resistor R2.

The differential amplifier 231 and the transistor 232 within the feed-back loop circuit 230 may negatively feed back the difference between the first voltage (i.e., 'R1*I1') and the second voltage (i.e., 'R2*I2'). The first voltage 'R1*I1' may be the voltage applied to the first resistor R1. The second voltage 'R2*I2' may be the voltage applied to the second resistor R2. The first current I1 may be a current flowing through the first resistor R1. The second current I2 may be a current flowing through the second resistor R2. Therefore, the voltage drops of the first resistor R1 and the second resistor R2 becomes substantially the same as each other and the first voltage 'R1*I1' and the second voltage 'R2*I2' may be kept as substantially the same as each other. Because the first voltage 'R1*I1' and the second voltage 'R2*I2' are kept as substantially the same as each other, the current Ip of the second pad PAD2 may be divided into the first current I1 and the second current I2 according to the resistance ratio of the first resistor R1 and the second resistor R2. Because of the above-described current division, the current ID of the second pad PAD2 may become greater as the value of the second resistor R2 becomes less.

A threshold voltage VTH as the electrical characteristic of the test pattern TPTN1 may be detected through a predetermined operation using the voltage level of the first pad PAD1 when the amount of the current Ip of the second pad PAD2 reaches a target value, e.g., 100 nA.

The above-described test operation may be repeated on the remaining test patterns TPTN2 to TPTNn to detect the characteristics of the threshold voltages of the plurality of test patterns TPTN1 to TPTNn, i.e., the N-type MOS transistors mostly configuring the semiconductor apparatus 11.

In accordance with an embodiment, the test circuit 200 may be able to increase the test-target current, i.e., the current Ip of the second pad PAD2 and therefore may reduce the influences of the second leakage current $I_{LEAK2}$ and the test equipment 12, which cause an error in the measuring process. Further, the amount of the test time may be reduced through the on-die EPM scheme.

While certain embodiments have been described above, it will be understood to those skilled in the art that the embodiments described are by way of example only. Accordingly, the test circuit of a semiconductor apparatus and the test system including the same should not be limited based on the described embodiments. Rather, the test circuit of a semiconductor apparatus and the test system including the same described herein should only be limited in light of the claims that follow when taken in conjunction with the above description and accompanying drawings. Furthermore, the embodiments may be combined to form additional embodiments.

What is claimed is:

1. A test circuit of a semiconductor apparatus, the test circuit comprising:
   a plurality of test-target elements;
   a first signal path configured to provide a voltage applied to a first pad, to a first test-target element selected from among the plurality of test-target elements;
   a current dividing circuit configured to divide a current through a second signal path and a third signal path, the current being caused by a voltage applied to a second pad; and
   a feed-back loop circuit configured to feed a result back by using the third signal path, the result being obtained by comparing a first voltage corresponding to the second signal path and a second voltage corresponding to the third signal path,
   wherein the first signal path includes a demultiplexer configured to couple, according to a control signal, the first pad to one of the plurality of test-target elements.

2. The test circuit of claim 1, wherein the current dividing circuit includes first and second resistor coupled in parallel to the second pad,
   wherein the second resistor has a resistance value which is reduced by a predetermined ratio from a resistance value of the first resistor.

3. The test circuit of claim 2, further comprising a demultiplexer configured to couple, according to a control signal, the first resistor to one of the plurality of test-target elements,
   wherein the demultiplexer and the first resistor are included in the second signal path.

4. The test circuit of claim 2, wherein the feed-back loop circuit includes:
   a differential amplifier configured to compare the first voltage and the second voltage with each other; and
   a transistor coupled between the second resistor and a ground and configured to operate according to an output of the differential amplifier.

5. The test circuit of claim 4, wherein the third signal path includes:
   the second resistor; and
   the transistor.

6. A test circuit of a semiconductor apparatus, the test circuit comprising:
   a plurality of test-target elements;
   a first demultiplexer configured to provide a voltage which is applied to a first pad, to a first node of a first test-target element selected from among the plurality of test-target elements;
   a first resistor coupled to a second pad;
   a second demultiplexer configured to provide a voltage which is applied to the first resistor, to a second node of the first test-target element;
   a second resistor coupled to the second pad in parallel with the first resistor; and
   a feed-back loop circuit configured to feed a result back to the second resistor, the result being obtained by comparing a first voltage applied to the first resistor and a second voltage applied to the second resistor.

7. The test circuit of claim 6, wherein the second resistor has a resistance value which is reduced by a predetermined ratio from a resistance value of the first resistor.

8. The test circuit of claim 6, wherein the feed-back loop circuit includes:
   a differential amplifier configured to compare the first voltage and the second voltage with each other; and
   a transistor coupled between the second resistor and a ground and configured to operate according to an output of the differential amplifier.

9. A test system comprising:

a test equipment configured to perform a test by applying a voltage through a first pad and by monitoring a current that flows through a second pad according to the voltage;

a semiconductor die to be tested, including a test circuit;

wherein the test circuit comprises:

a first resistor coupled between a plurality of test-target elements and the second pad; and a second resistor coupled to the second pad in parallel with the first resistor, wherein the test circuit is configured to feed a result back by using the second resistor, the result being obtained by comparing a first voltage applied to the first resistor and a second voltage applied to the second resistor.

10. The test system of claim 9, wherein the test circuit further comprises:

a first demultiplexer configured to provide a voltage which is applied to the first pad, to a first node of a first test-target element selected from among the plurality of test-target elements;

a second demultiplexer configured to provide a voltage which is applied to the first resistor, to a second node of the first test-target element; and a feed-back loop circuit configured to feed the result back by using the second resistor.

11. The test system of claim 10, wherein the feed-back loop circuit includes:

a differential amplifier configured to compare the first voltage and the second voltage with each other; and a transistor coupled between the second resistor and a ground and configured to operate according to an output of the differential amplifier.

12. The test system of claim 9, wherein the second resistor has a resistance value which is reduced by a predetermined ratio from a resistance value of the first resistor.

* * * * *